US008115286B2

(12) United States Patent
Zhang et al.

(10) Patent No.: US 8,115,286 B2
(45) Date of Patent: Feb. 14, 2012

(54) INTEGRATED SENSOR INCLUDING SENSING AND PROCESSING DIE MOUNTED ON OPPOSITE SIDES OF PACKAGE SUBSTRATE

(75) Inventors: Wenwei Zhang, Bellshill (GB); Len Muslek, Calderbank (GB); Jamie Boyd, Symington (GB); Mark Nesbitt, Livingston (GB); Martyn Dalziel, Airdrie (GB)

(73) Assignee: Honeywell International Inc., Morristown, NJ (US)

( * ) Notice: Subject to any disclaimer, the term of this patent is extended or adjusted under 35 U.S.C. 154(b) by 284 days.

(21) Appl. No.: 12/580,968

(22) Filed: Oct. 16, 2009

(65) Prior Publication Data

US 2010/0133629 A1  Jun. 3, 2010

Related U.S. Application Data

(60) Provisional application No. 61/107,631, filed on Oct. 22, 2008.

(51) Int. Cl.
  *H01L 23/495* (2006.01)
(52) U.S. Cl. . 257/676; 257/666; 257/672; 257/E23.037; 257/E23.038; 257/E23.039; 257/E23.04
(58) Field of Classification Search .................. 257/666, 257/672, 676, E23.037, E23.038, E23.039, 257/E23.04
See application file for complete search history.

(56) References Cited

U.S. PATENT DOCUMENTS

| | | | |
|---|---|---|---|
| 5,523,608 A | 6/1996 | Kitaoka et al. | |
| 6,798,057 B2* | 9/2004 | Bolkin et al. | 257/686 |
| 7,309,913 B2* | 12/2007 | Shim et al. | 257/686 |
| 7,372,129 B2* | 5/2008 | Bowen | 257/666 |
| 7,432,588 B2* | 10/2008 | Kimura | 257/686 |
| 7,459,770 B2* | 12/2008 | Tsai et al. | 257/666 |
| 7,576,440 B2* | 8/2009 | Song et al. | 257/786 |
| 7,705,469 B2* | 4/2010 | Yoshida | 257/777 |
| 7,763,493 B2* | 7/2010 | Tay et al. | 438/106 |
| 7,939,920 B2* | 5/2011 | Wallace | 257/676 |
| 2002/0076853 A1 | 6/2002 | Kramer et al. | |
| 2005/0146000 A1 | 7/2005 | Kim et al. | |
| 2006/0220189 A1 | 10/2006 | Sakamoto et al. | |
| 2007/0164402 A1 | 7/2007 | Jung et al. | |
| 2007/0210443 A1* | 9/2007 | Merilo et al. | 257/704 |
| 2008/0150103 A1* | 6/2008 | Wang et al. | 257/676 |
| 2008/0283981 A1* | 11/2008 | Chou et al. | 257/670 |
| 2010/0001385 A1* | 1/2010 | Caparas et al. | 257/676 |

OTHER PUBLICATIONS

Written Opinion and International Search Report, from corresponding PCT Application Serial No. PCT/US2009/061212, mailed Jun. 1, 2010, 7 pages.

* cited by examiner

*Primary Examiner* — Ida M Soward
(74) *Attorney, Agent, or Firm* — Shumaker & Sieffert, P.A.

(57) ABSTRACT

An integrated circuit (IC) device includes a lead frame having a first and a second opposing surface and a plurality of lead fingers. A first die including a signal processor is mounted on the first surface of the lead frame while a second die is mounted on the second surface of the lead frame. The second die includes at least one sensor that senses at least one non-electrical parameter and has at least one sensor output that provides a sensing signal for the parameter. The sensor output is coupled to the signal processor for processing the sensing signal.

12 Claims, 8 Drawing Sheets

INTEGRATED SENSOR INCLUDING SENSING AND PROCESSING DIE MOUNTED ON OPPOSITE SIDES OF PACKAGE SUBSTRATE

CROSS REFERENCE TO RELATED APPLICATIONS

This application claims the benefit of Provisional Application Ser. No. 61/107,631 entitled "INTEGRATED CIRCUIT DEVICE INCLUDING SENSOR DIE FOR SENSING PARAMETERS AND DIE FOR SIGNAL PROCESSING SENSOR DIE SIGNALS" filed Oct. 22, 2008, which is herein incorporated by reference in its entirety.

FIELD

Disclosed embodiments relate to integrated circuit (IC) devices and more particularly to IC devices that include a package substrate and both a sensing die and a signal processing die.

BACKGROUND

Sensor devices are widely used to provide measurements of physical quantities for control and/or monitoring purposes. In general, sensor devices are used in numerous applications and industries including automotive, aerospace, medicine, manufacturing, and robotics. For example, humidity sensors are generally used for applications including air conditioning control and monitoring, safety and security monitoring, home appliance moisture and temperature control, energy efficiency monitoring, humidity switch control, printing or other reproduction equipment operation, weather monitoring, and air quality monitoring.

SUMMARY

Disclosed embodiments have the first and second IC die, including the signal processing die and sensing die, respectively, positioned on opposite sides of a package substrate, such as a PCB or lead frame. The sensor on the sensing die senses at least one non-electrical parameter, such as, but not limited to, temperature, magnetic field, a mechanical parameter, chemicals or biochemicals, optical radiation, ionizing radiation, acoustics, or humidity, and provides a sensing signal for the parameter at one or more sensor outputs.

Disclosed embodiments allow the first and second die to be positioned on the package substrate in a configuration which reduces the overall footprint of the IC device. In one embodiment the first and second die can at least partially overlap one another, thus reducing the overall minimum footprint for the IC device. In another embodiment, the bonding areas of the two dies can at least partially overlap, thus again reducing the overall minimum footprint of the IC device. Reduced size may allow compatibility with an increased number of applications, and also may lower cost in terms of reducing board mounting area.

DETAILED DESCRIPTION

Disclosed embodiments are described with reference to the attached figures, wherein like reference numerals are used throughout the figures to designate similar or equivalent elements. The figures are not drawn to scale and they are provided merely to illustrate the disclosed embodiments. Several aspects disclosed herein are described below with reference to example applications for illustration. It should be understood that numerous specific details, relationships, and methods are set forth to provide a full understanding of the disclosed embodiments and their equivalents. One having ordinary skill in the relevant art, however, will readily recognize that the disclosed embodiments can be practiced without one or more of the specific details or with other methods. In other instances, well-known structures or operations are not shown in detail to avoid obscuring aspects of the disclosed embodiments. Disclosed embodiments are not limited by the illustrated ordering of acts or events, as some acts may occur in different orders and/or concurrently with other acts or events. Furthermore, not all illustrated acts or events are required to implement a methodology in accordance with the disclosed embodiments of their equivalents.

Disclosed embodiments provide IC device-based sensors in which the first and second IC die including the signal processing die and sensing die, respectively, are positioned on opposite sides of a package substrate in a configuration that reduces the overall footprint of the IC device. Furthermore, as described below, packaging techniques can be utilized to protect the sensor(s) on the sensor die from potential damage and contamination during assembly.

The term "package substrate," as used herein, includes in one embodiment a PCB that can be single or multi-layer PCB. The PCB substrate can be a ceramic or a polymer substrate. In another embodiment, the package substrate comprises a lead frame, including either a leaded or leadless package, such as a copper (Cu)-based lead frame. However, the term "package substrate", as used herein, excludes an IC die, such as a silicon-based IC die. The term "sensor device" or "sensor", as used herein, refers to any transducer device that measures a physical (i.e., non-electrical) parameter, generally an environmental parameter, and converts the non-electrical (e.g., physical) parameter into a signal, generally to an electrical signal, which can be read by an observer or by an instrument. In disclosed embodiments, the sensor IC can include, but is not limited to, a thermal (i.e., temperature) sensor, an electromagnetic sensor (e.g., magnetic field sensor), a mechanical sensor, a chemical or biochemical sensor, an optical radiation sensor, an ionizing radiation sensor, an acoustic sensor, or a humidity sensor.

Figure 1A:
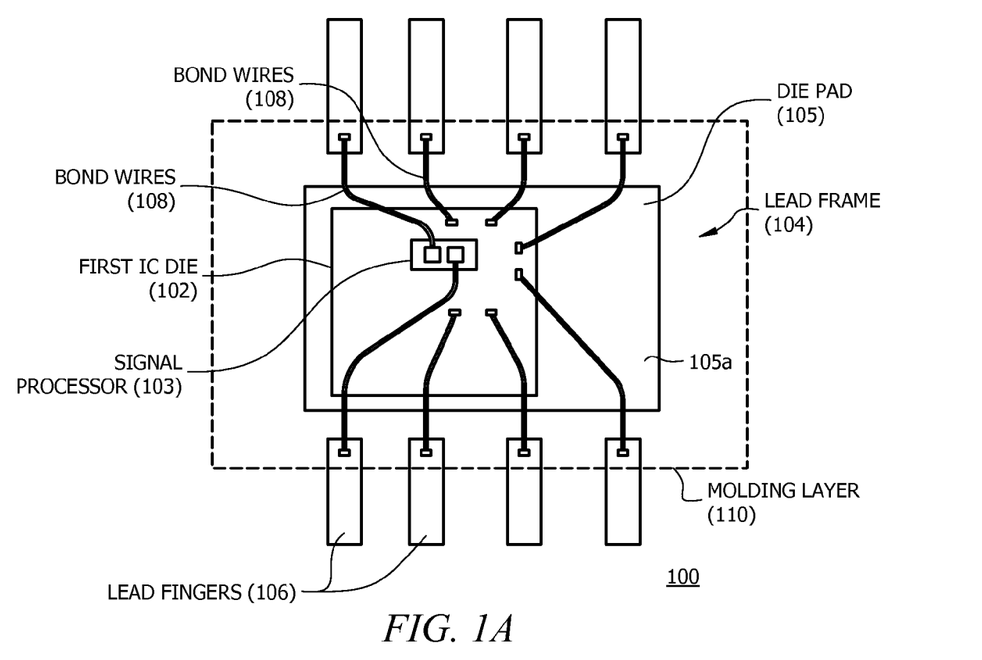
FIGS. 1A and 1B show top and bottom views, respectively, of an exemplary IC device including a lead frame substrate, according to a disclosed embodiment.
Figure 1B:
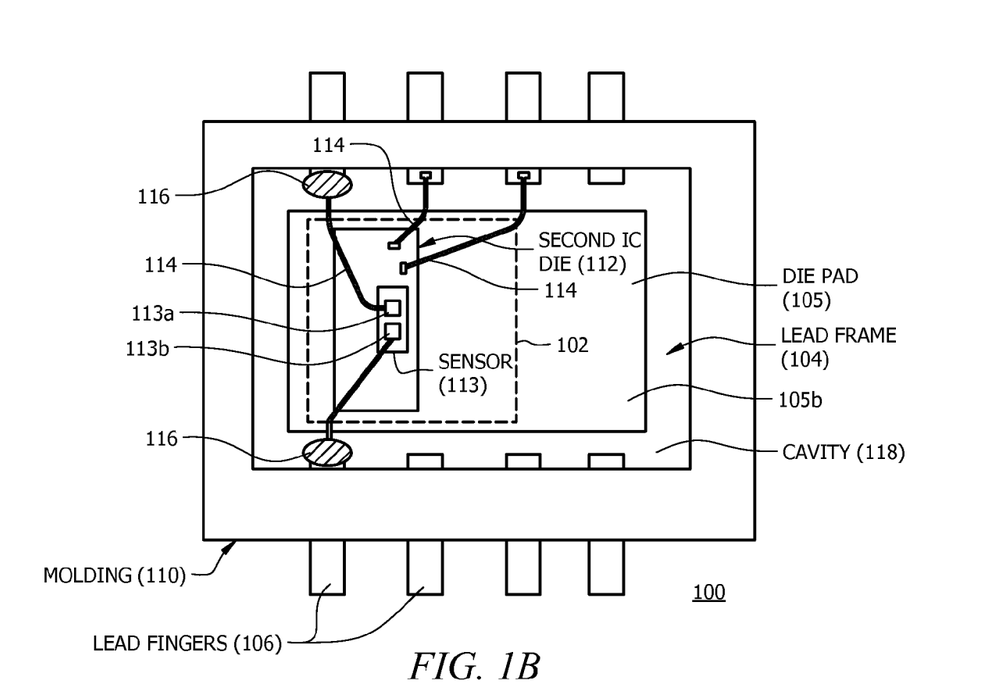

Top and bottom views of an exemplary IC device 100 including a lead frame substrate in accordance with a disclosed embodiment are shown in FIGS. 1A and 1B, respectively. IC device 100 includes at least two IC die. One IC die has one or more sensors formed thereon during fabrication for providing at least one sensing signal and another IC die, such as an ASIC die, is for signal processing the sensing signal.

As shown in FIG. 1A, a first IC die 102 including a signal processor 103 is mounted on a first surface 105a of the package substrate shown in FIG. 1A as a lead frame 104 which comprises a die pad 105 and a plurality of lead fingers 106. In one embodiment, first die 102 comprises an ASIC die that can include a memory for storing an individualized calibration algorithm for the sensor, temperature compensation, and digital outputs.

Packaged semiconductor devices commonly utilize a lead frame such as lead frame 104 to provide die support and electrical connection between the die (e.g., via bond wires to bond pads on the surface of the IC die) and electrical connection points external to the package via the lead frame's lead fingers 106. Although eight lead fingers are shown in FIG. 1A (thus providing an eight lead IC device), disclosed embodiments can have more or less than 8 leads.

The first die 102 can be attached to the first surface 105a of the die pad 105 using one or more adhesive materials. For example, a silver filled epoxy is a commonly used adhesive material for IC assembly that is both electrically and thermally conductive. A variety of other adhesives having varying electrical and thermal conductivities may be used depending on the characteristics of the first die 102 and application specifics.

Although the exemplary IC device 100 shown in FIGS. 1A and 1B has a package substrate comprising a lead frame 104, disclosed embodiments are not limited in this regard. As noted above, other package substrates, including PCB substrates, can generally be used (see FIG. 1C described below for an embodiment including a PCB substrate). Additionally, as shown in FIG. 1A, the first die 102 (e.g., via bond pads on the surface of the first die 102) is electrically coupled to the lead fingers 106 using one or more wire bond (i.e. bond wire) connections 108. Although the exemplary IC device 100 is shown with the first die 102 electrically coupled to the lead fingers 106 using wire bond connections 108, disclosed embodiments are not limited in this regard and other types of connections can be used. For example, as described below, first die 102 can include FC bond pads so that FC mounting may be used. In yet another embodiment, first die 102 can be mounted face up, such as when the first die 102 includes through substrate vias (TSVs).

The first die 102 and the wire bond connections 108 can be protected by providing one or more molding layers 110 or protective layers (not shown). For example, as shown in FIG. 1A, the molding layer 110 can encapsulate the first die 102 to prevent damage to the first die 102 and the wire bond connections 108 during attachment of a second IC die 114 on the other side of the die pad 105 of lead frame 104 as described below relative to FIG. 1B, or during operation of the IC device 100. Furthermore, the wire bond connections 108 can be protected by providing one or more protective layers. For example, prior to deposition of the molding compound layers, a dielectric material, such as a silicone material, can be used to protect the wire bond connections 108.

The molding layer 110 can also be formed on a second surface 105b (e.g., bottom surface) of the die pad 105 of lead frame 104, as shown in the bottom view of IC device 100 shown in FIG. 1B. A second IC die 112 which includes at least one sensor 113 formed thereon is attached to the second surface 105b of die pad 105 using one or more adhesive materials. Second (e.g., bottom) surface 105b of the die pad 105 is on an opposite side of the die pad 105 relative to the first (e.g., top) surface 105a in which first die 102 is attached. Furthermore, the second die 112 can be positioned on the second surface 105b so that the areas of the first die 102 and second die 112 dies overlap, to reduce the minimum total footprint of the IC device 100. For example, as shown in FIGS. 1A and 1B, since the first die 102 has a larger area than the second die 112, the minimum footprint of IC device 100 can be set by the area of the first die 102, rather than being set by the sum of the areas of dies 102 and 112.

Additionally as shown in FIG. 1B, the second die 112 can be electrically coupled to lead fingers 106 of the lead frame 104 using a one or more wire bond connections 114. Sensor 113 is shown including bond pads 113a and 113b which provide the sensor outputs. As shown in FIG. 1B, sensor outputs 113a and 113b are coupled to lead fingers 106 by bond wires 114. Coupling between the sensor outputs 113a and 113b and devices on the first die 102 is generally accomplished by connecting the sensor outputs 113a and 113b to lead fingers that are coupled to device inputs on the first die 102, such as to an analog to digital converter (ADC) on first die 102 (ADC not shown in FIGS. 1A and 1B).

Although the exemplary IC device 100 is shown with the second die 112 electrically coupled to the lead fingers 106 using wire bond connections, as disclosed above disclosed embodiments are not limited in this regard and other types of connections can be used. For example, in other embodiments, the second die 112 and the lead frame 104 can be configured to utilize a FC or a flat pack-type arrangement, or face-up arrangement for electrically coupling the second die 112 and the lead frame 104, as further described below. The wire bond connections 114 can be protected by providing one or more protective layers 116 over at least portions of the wire bond connections 114. For example, if gold wire bonding techniques are used, a dielectric material, such as a silicone material, can be used to protect the bonds on the lead frame 104. As known in the art, for gold wire bonding, the gold comprising connections on the second die 112 are typically resistant to reliability impacting corrosion.

Generally, in order to allow the sensor 113 on second die 112 to operate properly, the molding layer 110 is not typically formed over the area of second surface 105b in which sensor 113 is mounted. For example, in the case of a humidity sensor, in operation sensor 113 is exposed to a local ambient to generate a sensing signal. Therefore, the molding layer 110 can be configured to provide a cavity (i.e., gap) 118 for exposing the sensor 113 on the second die 112 to the ambient. In some embodiments, as shown in FIG. 1B, the cavity 118 can extend over the area of the second surface 105b to allow later placement of the second die 112, as described below with respect to FIGS. 2A-2F.

The molding layer 110 can be formed separately on the first side 105a and the second side 105b of the die pad 105 or other die attach surface. However, in other embodiments, the molding compound layers 110 can be a single layer that is thus integrally formed on both sides of the package substrate. Such a configuration can reduce the number of steps required to assemble the IC device 100. Furthermore, such a configuration can allow pick and place methods to be used for forming the IC device 100. Such a process flow is shown below with respect to FIGS. 2A-2F.

Figure 1C:
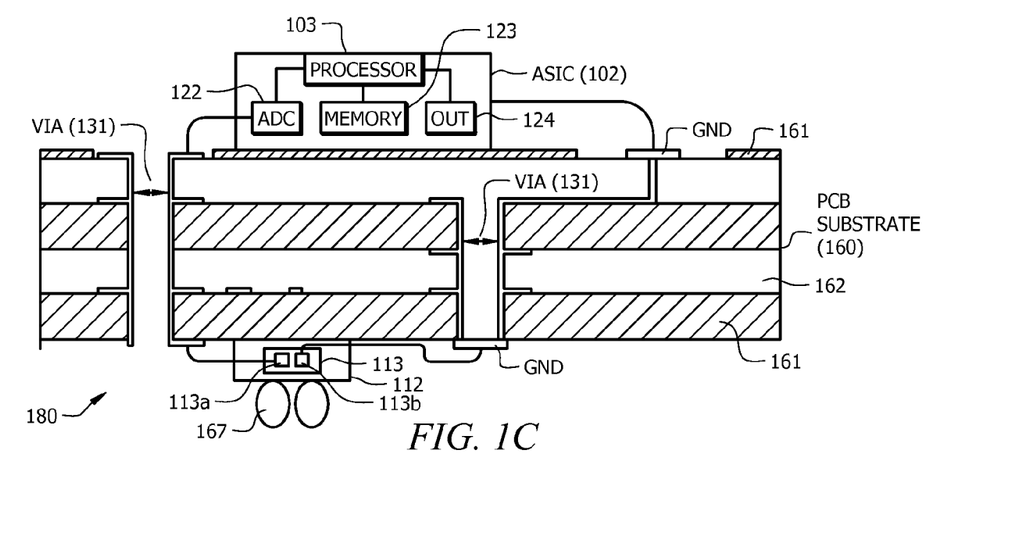
FIG. 1C is a side view depiction of an exemplary IC device including a PCB substrate, according to a disclosed embodiment.

FIG. 1C is a side view depiction of an exemplary IC device 180 including a multi-layer PCB substrate 160 including dielectric layers 161 and metal layers 162, according to another disclosed embodiment. First die 102 is shown an application specific integrated circuit (ASIC) 102 including a signal processor 103, an ADC 122, a memory circuit 123 for storing a calibration algorithm and temperature compensation algorithm, and digital outputs 124 for providing digitized and processed sensing signals, such as processed humidity signals. Via connections 131 are shown for electrically coupling bond pad 113a of sensor 113 on second die 112 to ADC 122 on ASIC die 102, and providing a common system ground (GND). Balls 167 (e.g., solder balls) are shown for mounting and electrically coupling IC device 189 onto another PCB or another substrate surface.

Figure 2A:
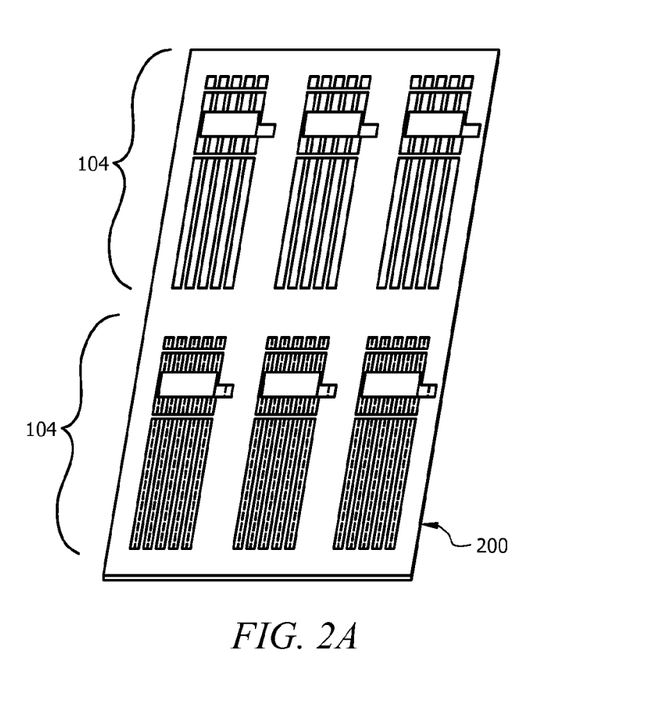
FIGS. 2A-2F show results at various intermediate assembly steps for the exemplary IC device shown in FIGS. 1A and 1B in accordance with a disclosed embodiment.
Figure 2B:
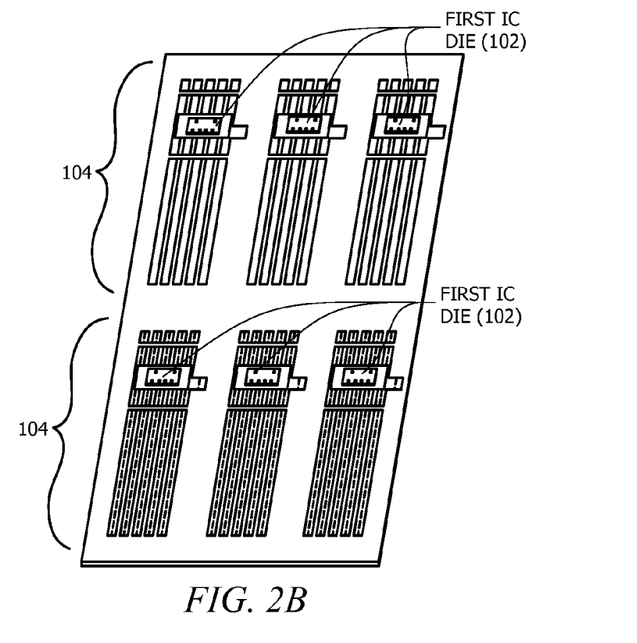
Figure 2C:
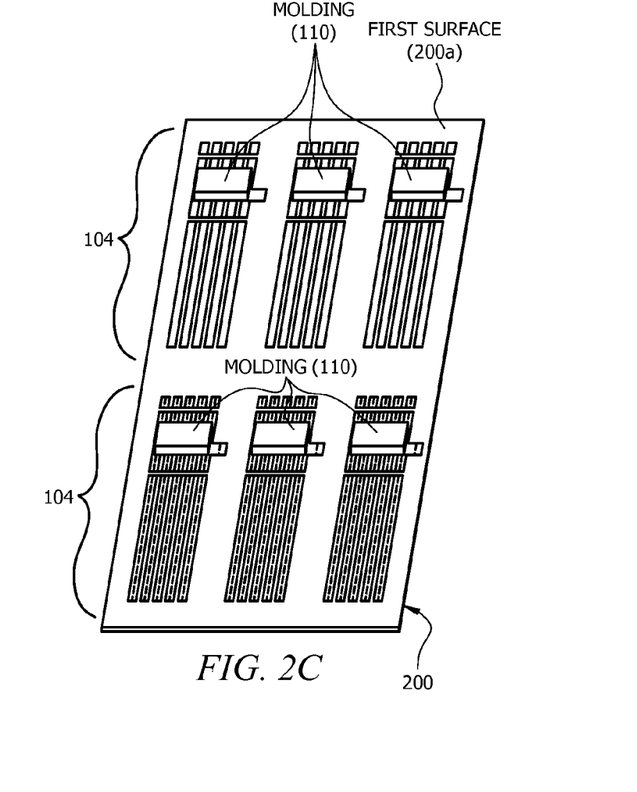

FIGS. 2A-2F show results at various intermediate assembly steps for the exemplary IC device 100 shown in FIGS. 1A and 1B. As shown in FIG. 2A, a package substrate sheet, such as a lead frame sheet 200, that includes a plurality of attached package substrates shown as a plurality of lead frames 104 shown in FIGS. 1A and 1B, can be provided. Although lead frame sheet 200 shown in FIG. 2A shows only 6 instances of lead frame 104, disclosed embodiments are not limited in this regard. In some embodiments lead frame sheet 200 can generally include any number of instances of package substrates, such as lead frames 104. Furthermore, although FIGS. 2A-2F show the lead frame sheet 200 as configured for forming 4-lead single in-line packages (SIP 4) or 8-lead dual in-line packages (DIP 8), as noted above, disclosed embodiments are not limited in this regard Once the lead frame sheet 200 is provided, first die 102 can be attached and bonded to each lead frame 104, with the result shown in FIG. 2B and as described above with respect to FIG. 1A. Such attachment and bonding can be performed manually or using an automated tool, such as a pick and place tool. Once the first die 102 is attached (i.e., joined) to each lead frame 104 on the lead frame sheet 200, molding layer 110 can be applied to the lead frame sheet 200. In particular, the molding layer 110 can be applied to a first surface 200a of the lead frame sheet 200 to encapsulate each instance of the first die 102, as shown in FIG. 2C and as described above with respect to FIG. 1A.

Figure 2D:
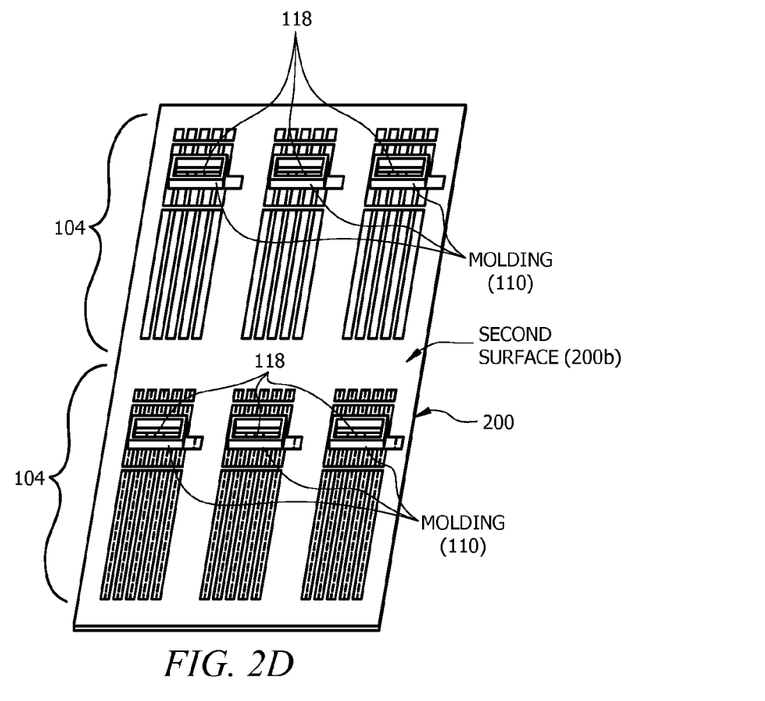

Additionally, as shown in FIG. 2D, the molding layer 110 can be applied, concurrently or separately, to a second surface 200b of the lead frame sheet 200. However, since no instances of the second die 112 have yet be attached to the lead frame sheet 200, the molding layer 110 is configured to form a cavity (i.e., gap) 118 for each lead frame 104 instance in the die pad area on the second surface 200b, as described above with respect to FIG. 1B, for attaching and electrically coupling a second die 112 to second surface 105b of each die pad 105.

Figure 2E:
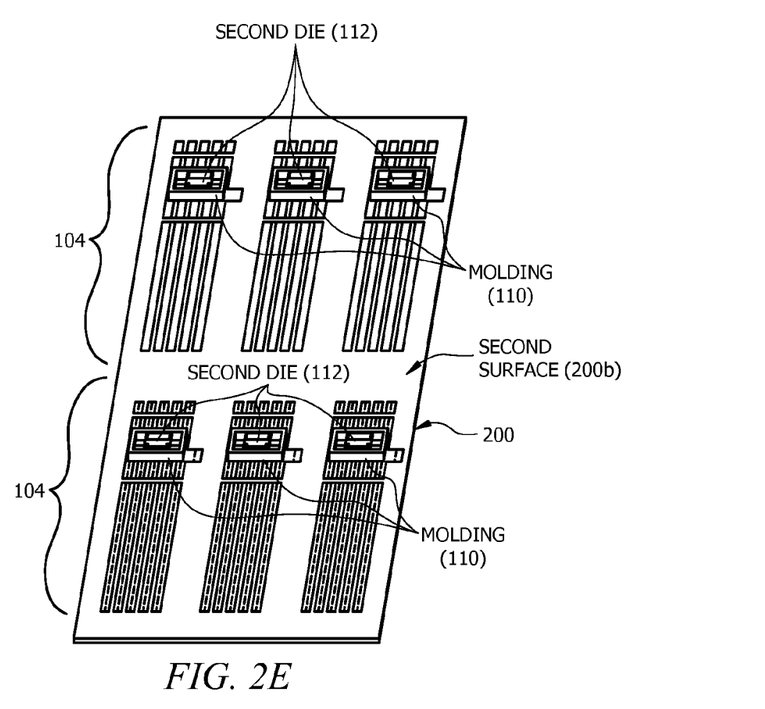
Figure 2F:
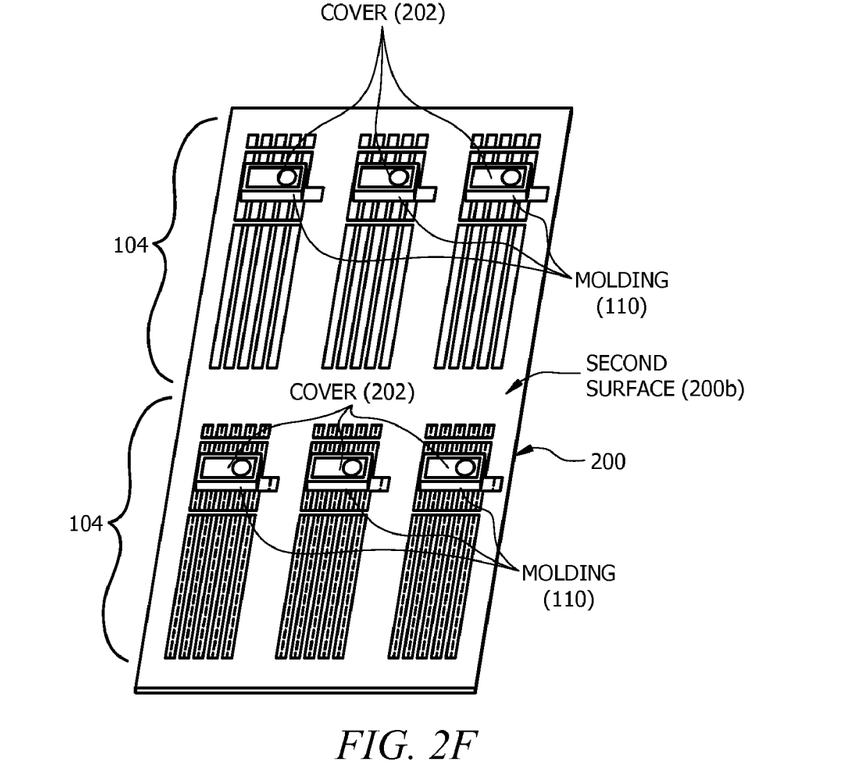

A second die 112 can be attached and bonded to each die pad 105, as shown in FIG. 2E and as described above with respect to FIG. 1B. Such attachment and bonding can be performed manually or using an automated tool, such as a pick and place tool. The lead frame sheet 200 can be de-barred and trimmed to form and separate the various instances of IC device 100 from the lead frame sheet 200. In some embodiments, a cover 202 can then be attached over cavities 118 reach molding layer 110 on the second surface 200b to protect each instance of the second die 202, as shown in FIG. 2F. In these embodiments, such a cover 202 can be attached using a variety of techniques including welding and an adhesive.

Figure 3:
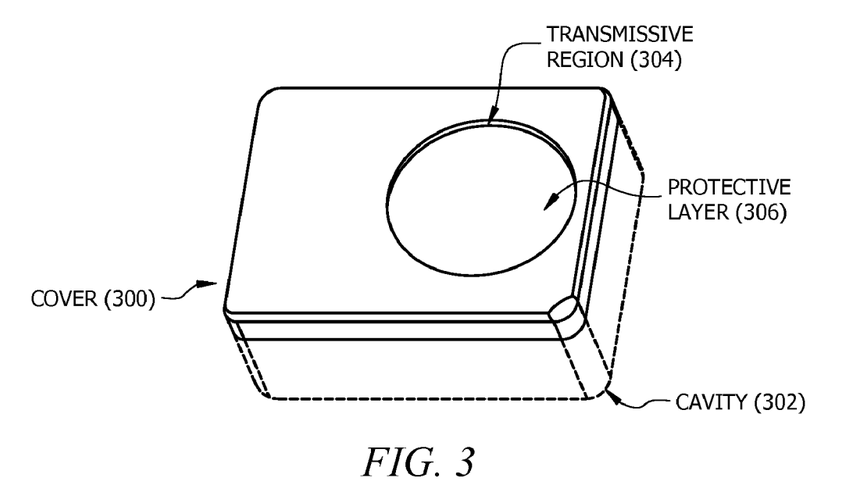
FIG. 3 shows a perspective top view of an exemplary cover for an IC device in accordance with another disclosed embodiment.

The cover 202 for the IC device can be provided in a variety of configurations. A perspective top view of an exemplary cover 300 is shown in FIG. 3. The cover 300 can be configured to extend over an area of mold layer cavity 302. Additionally, as shown in FIG. 3, the cover 300 can include at least one transmissive region 304 for exposing or providing access to a sensor (not shown) positioned in the cavity 302 to the ambient. The term "access," as used herein with respect to a sensor, refers to sufficiently exposing the sensor to the environment for which the physical parameter is to be measured. Accordingly, access can be direct or indirect, depending on the type of physical parameter.

In some embodiments, the transmissive region 304 can be located directly above a sensor in the cavity 302. However, in other embodiments, the sensor in the cavity 302 and the transmissive region which can comprise an aperture need not be aligned. For example, in the case of a humidity sensor in the cavity 302, the sensor need not have a direct line of sight through the transmissive region 304, as opposed to an optical sensor. In some disclosed embodiments, a transmissive region 304 in the cover 300 is not needed to provide access to the sensor in the cavity 302. For example, an aperture can be formed simply by providing a cover 300 that fails to cover the entire cavity 302. Alternatively, the cover 300 can comprise multiple sections, such that when positioned over the cavity 302, the multiple sections fail to cover the cavity 302 completely and therefore provide apertures.

In some embodiments, a protective layer 306 can be placed on or in the transmissive region 304 with respect to the parameter of interest, such as an aperture to protect the sensor in the cavity 302. For example, in the case of a humidity sensor or other moisture-sensitive sensing device placed in the cavity 302, to prevent water from entering the cavity 302 and affecting sensor operations, the protective layer 306 can be a filter for blocking water. Such a filter can be constructed from known hydrophobic filtering materials such that large water droplets are prevented from entering the cavity 302, but gas such as air containing moisture (e.g., water vapor) can still freely enter the cavity 302 and permit a reliable humidity measurement. However, disclosed embodiments are not limited to covers adapted solely for humidity measurements. In other embodiments, the cover 300 and the protective layer 306 in the transmissive region 304 can be adapted other measurements. For example, in the case of optical measurements, the protective layer 306 can comprise one or more optical filters to facilitate sensor operation.

As described above, in some embodiments an IC having a sensor can include FC bonding pads and the package substrate can include land pads configured to form joints (e.g., solder mediated) with the FC bonding pads, rather than wire bond connections. For example, in the case of a humidity sensor comprising a capacitive die set in thermoset polymers that interact with platinum electrodes, the bonding pads of capacitive die can be located on a first surface of the capacitive die and the humidity sensing polymer can be located on an opposite side of the capacitive die. The elimination of wire bonds can improve protection from potential contamination and limit package substrate/die bonding damage. An exemplary lead frame for attaching a FC die is shown in FIG. 4A.

Figure 4A:
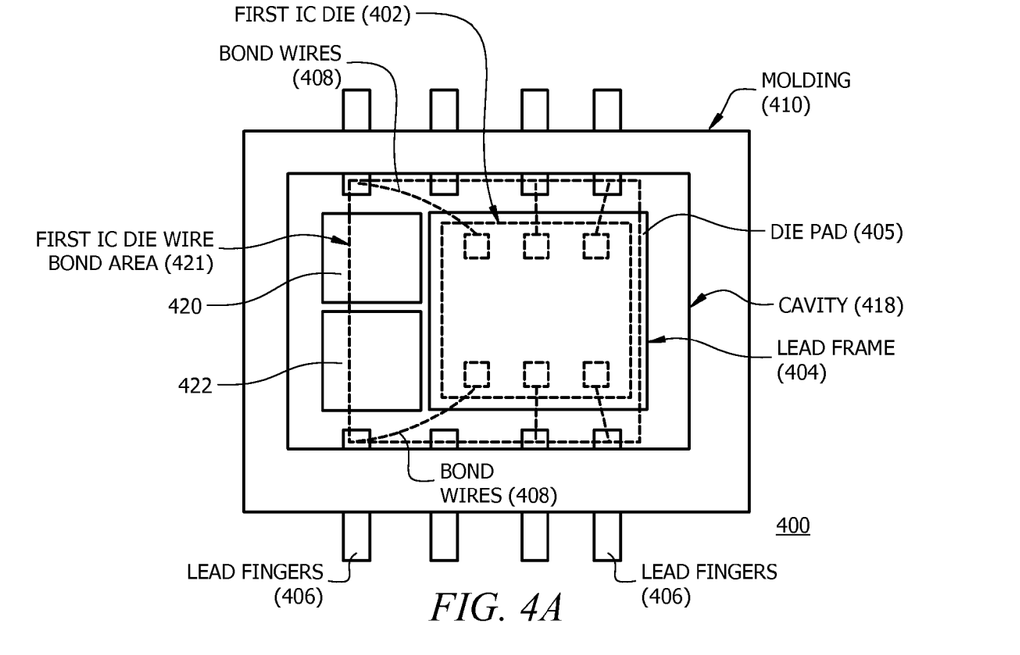
FIG. 4A shows a bottom view of an exemplary IC device, including flip-chip (FC) pads for attaching a second die including at least one sensor device, according to a disclosed embodiment.

FIG. 4A shows a bottom view of an exemplary IC device 400 including FC pads for attaching a second die including at least one sensor formed thereon according to a disclosed embodiment. As shown in FIG. 4A, the IC device 400 can be formed similarly to the IC device 100 shown in FIGS. 1A and 1B, except the respective die in FIG. 4A are laid out on the package substrate so that although the respective die do not overlap one another, their respective bonding areas do overlap as evidenced by the first IC die wire bond area 421 shown in FIG. 4A. IC device 400 includes a lead frame 404 comprising a die pad 405 and lead fingers 406, a first die 402 shown with dashed lines to indicate mounting on the top side of die pad 405 (thus not being visible in the bottom view provided) connected to the lead fingers 406 with bond wires 408, and molding layer 410 encapsulating the first IC die 402 and forming a cavity 418 for attaching an IC die including a sensor. In the configuration shown in FIG. 4A, the lead frame 404 includes first and second FC land pads 420, 422 for attaching first and second terminals of a second die 412 that includes a sensor 413 on the other side (e.g., top side) of lead frame 404.

Figure 4B:
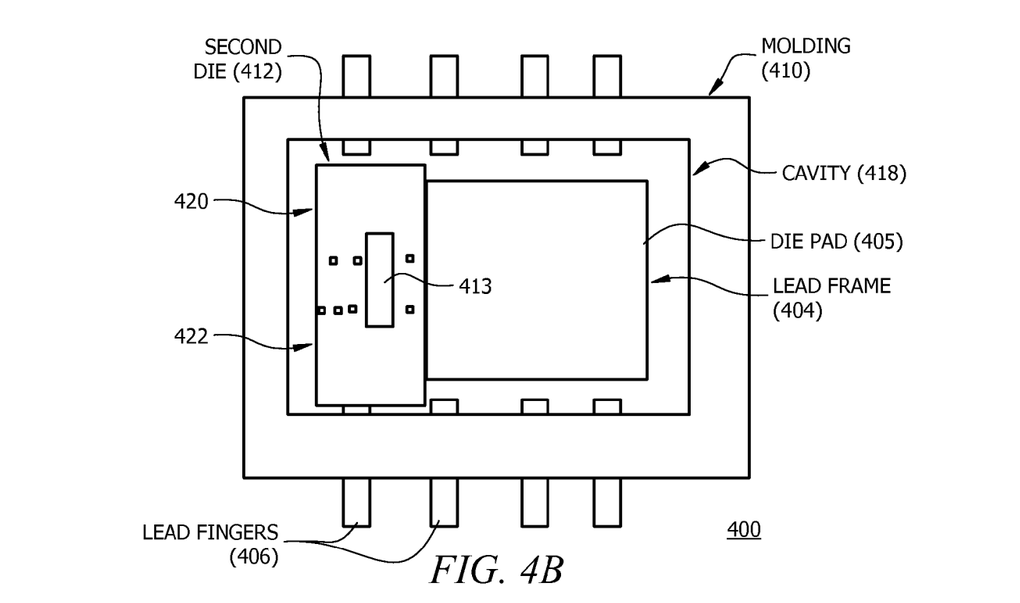
FIG. 4B shows a bottom view of an exemplary IC device in FIG. 4A subsequent to attaching a second die including at least one sensor device.

FIG. 4B shows a bottom view of the IC device 400 after attaching a second die 412 including at least one sensor 413 over FC chip land pads 420 and 422 shown in FIG. 4A. The bonding area for second die 412 is beneath second die 412 over the FC land pads 420 and 422 (see FIG. 4A for FC land pads 420 and 422), so that the bonding area which is under second die 412 overlaps the bonding area 421 for first die 402. Although only two FC land pads 420 and 422 are shown in FIG. 4A, disclosed embodiments have no such limitation. In the arrangement shown, the amount of contamination and wire bonding damage can be minimized without generally affecting operation of the sensor 413. Furthermore, since no wire connections are required to directly connect sensor 413 to first die 402 via FC chip land pads 420 and 422 of lead frame 404, such an approach can improve reliability of the sensor 413 and result in an IC device 400 that can be adapted for harsher chemical environments or more extreme weather.

The exemplary IC devices described above include two IC die in which a sensor comprising IC die is on an opposite side of a package substrate and faces an opposite direction related to the IC die which provides signal processing, such as an ASIC die. However, disclosed embodiments are not limited in this regard. In some disclosed embodiments, the sensor comprising die and the processing (e.g., ASIC) die can be on opposite sides of a package substrate and both face the same direction, without affecting operation of the sensor. That is, the sensor can face a package substrate and can operate via one or more transmissive regions in the package substrate and the molding compound layers on a first surface of the package substrate. An exemplary arrangement for such an IC device is described with respect to FIGS. 5A-5D.

Figure 5A:
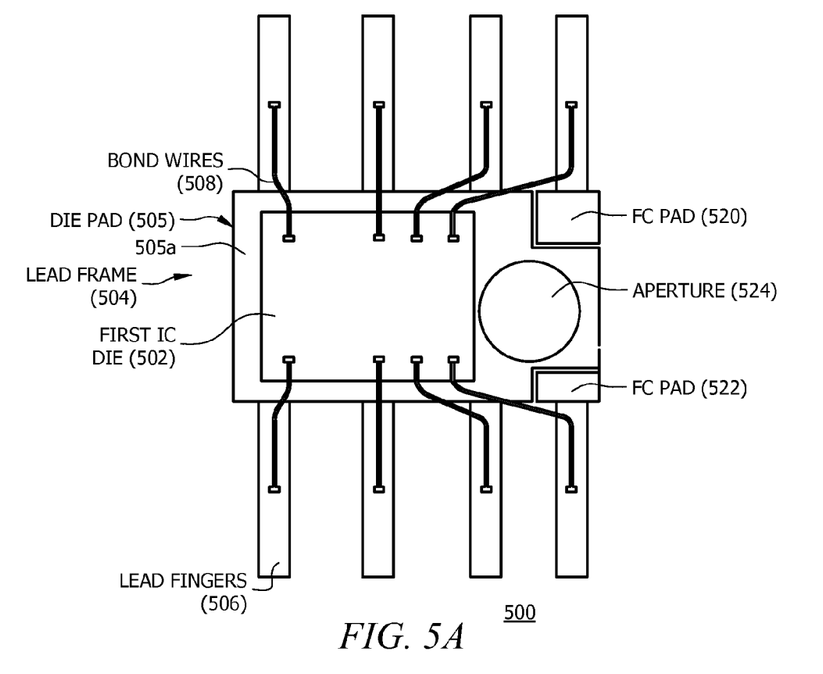
FIGS. 5A-5E show results at various intermediate assembly steps for an exemplary IC device including a lead frame and molding compound apertures in accordance with a disclosed embodiment.
Figure 5B:
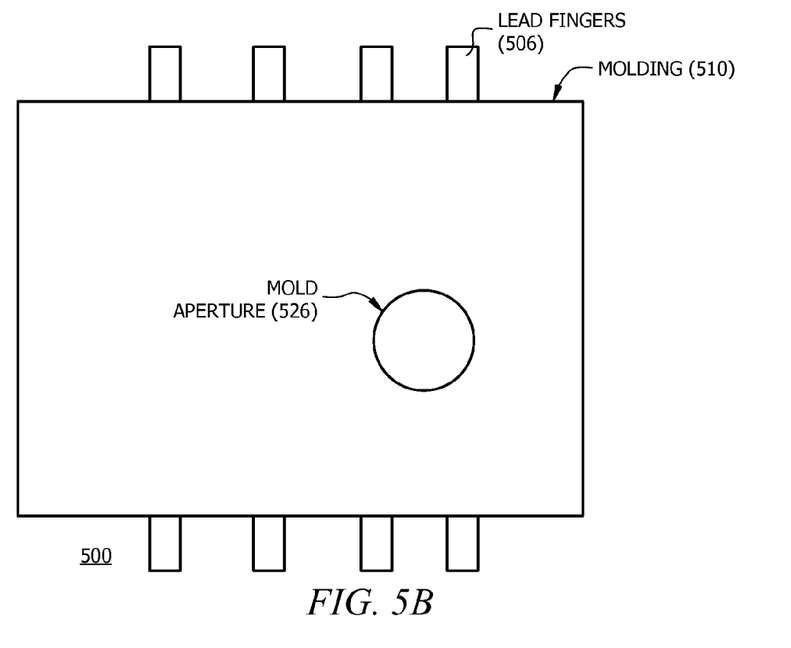
Figures 5C, 5D, 5E:
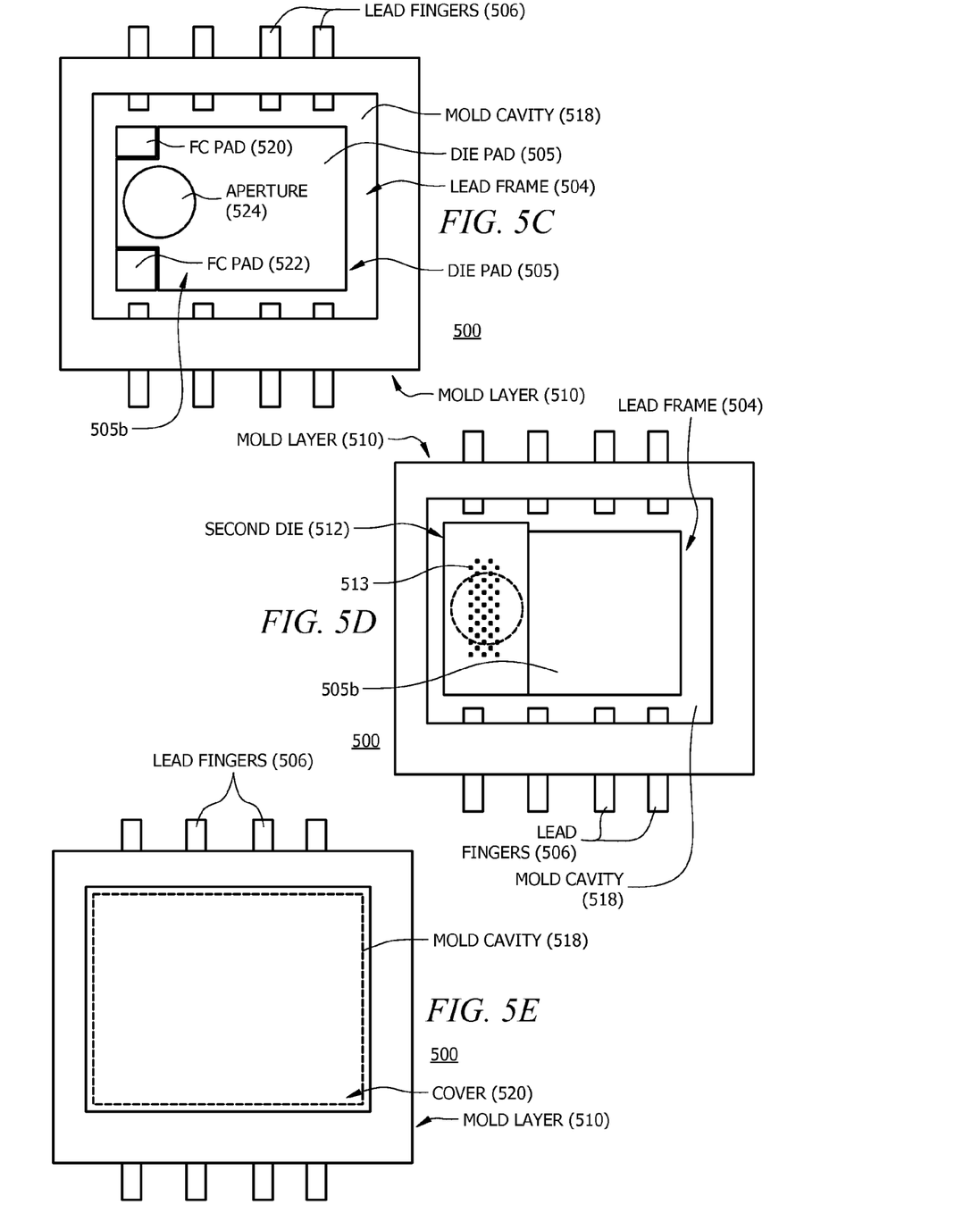

FIGS. 5A-5E show the result at various intermediate assembly steps for an exemplary IC device including a lead frame, sensor comprising die and processor comprising die, and molding compound apertures in accordance with a disclosed embodiment. FIG. 5A shows a top view of an IC device 500 prior to mounting a sensor. As shown in FIG. 5A, and as previously described with respect to the IC device 100 in FIGS. 1A-1B, but prior to isolating die pad 505 from lead fingers 506, the IC device 500 is shown including a lead frame 504 with die pad 505 and lead fingers 506, a first die 502 mounted on a first surface 505a of the die pad 505 with bond wires 508. In the IC device 500 shown in FIG. 5A, the lead frame 504 also includes first and second FC pads 520, 522 for attaching first and second terminals of a second die including a sensor. As shown in FIG. 5A, the lead frame 504 includes at least one lead frame aperture 524 (e.g., area void of lead frame metal). The aperture 524 can be used to provide access to a sensor mounted on a second surface of the lead frame 504, as described below. As described above with respect to IC device 100 in FIGS. 1A and 1B, in IC device 500 can further include molding layer 510 encapsulating the first die 502. However, to provide access to a sensor mounted on a second surface of the lead frame, the molding layer 510 can also include at least one molding compound aperture 526 overlapping at least a portion of the lead frame aperture 524, as shown in FIG. 5B. As described above with respect to FIG. 1B and as shown in FIG. 5C, the molding layer 510 on a second surface 505a of the lead frame 504 can be configured to provide a cavity 518 (see FIG. 5C) for mounting a second die therein.

FIG. 5C shows a bottom view of IC device 500 prior to mounting a second die 512. As shown in FIG. 5C, the cavity 518 can be formed such that the aperture is not occluded by the molding layer 510. In FIGS. 5A-5C, lead frame apertures 524 and mold aperture 526 are shown to have approximately the same dimensions. However, disclosed embodiments are not limited in this regard and the apertures 524 and 526 can be of different sizes, provided that their overlapping portions provide a sufficiently large area to access a sensor in the cavity 518. Furthermore, as previously described with respect to FIG. 3, one or more protective layers in the lead frame aperture 524, the molding compound aperture 526, or both, can be used to protect the sensor in the cavity 518. Lead frame 504 is seen to include FC pads 520 and 522.

FIG. 5D shows a bottom view of IC device 500 subsequent to mounting a second die 512 within a cavity 518 so that second die 512 is mounted over and bonded to FC pads 520 and 522, and is also mounted over lead frame aperture 524. As a result, second die is mounted within the footprint of first die 502 which is mounted on the other side of the die pad 505. As shown in FIG. 5D, the second die 512 can include at least one sensor 513 mounted on a second surface 505b of the die pad 505 so that the sensor 513 is accessible (e.g., to sense the local ambient therefrom) from the first surface 505a (opposite second surface 505b) via apertures 524 and 526. That is, the sensor 513 is mounted to face the second surface 505b of the lead frame 504 and is positioned directly above apertures 524 and 526. However, disclosed embodiments are not limited in this regard. For example, in the case of a humidity sensor, the sensor 513 need only have access to the ambient. Therefore, in such embodiments, the sensor 513 can face the second surface 505b and be positioned away from the apertures 524 and 526 and still provide reliable measurements. After the second die 512 is mounted, a cover 520 can be attached to the molding layer 510 to close the cavity, as shown in FIG. 5E. In such embodiments, apertures are not required on the cover 520 to provide access to the sensor. However, disclosed embodiments are not limited in this regard. In some embodiments, the second die 512 can include sensors on both of its sides (i.e., top and bottom). Accordingly to provide access to the sensors one or more transmissive regions, such as apertures, can be provided in the cover 520, as previously described.

By providing high level integration of a sensor comprising die and a processor comprising die in IC devices disclosed herein, several advantages result. For example, the close proximity of the sensor to the processing electronics substantially improves signal quality through improved signal-to-noise ratio and bandwidth.

The ICs described above can be formed from semiconductor substrates which may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, disclosed embodiments and their equivalents can be used in a variety of processes including bipolar, CMOS, BiCMOS, and MEMS.

While various disclosed embodiments have been described above, it should be understood that they have been presented by way of example only, and not limitation. Numerous changes to the disclosed embodiments can be made in accordance with the disclosure herein without departing from the spirit or scope disclosed herein. Thus, the breadth and scope of the disclosed embodiments should not be limited by any of the above described embodiments. Rather, the scope of the disclosed embodiments should be defined in accordance with the following claims and their equivalents.

Although the disclosed embodiments has been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting disclosed embodiments or their equivalents. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which the disclosed embodiments belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. An integrated circuit (IC) device, comprising:
    a lead frame comprising a die pad and a plurality of lead fingers having a first and a second opposing surface;
    a first die comprising a signal processor mounted on said first surface of said die pad, and
    a second die mounted on said second surface of said die pad, wherein said second die comprises at least one sensor that senses at least one non-electrical parameter and has at least one sensor output that provides a sensing signal,
    wherein said sensor output is coupled to said signal processor, and wherein said first die processes said sensing signal.

2. The IC device of claim 1, wherein said second die and said first die at least partially overlap one another.

3. The IC device of claim 1, wherein a bonding area of said second die and a bonding area of said first die at least partially overlap one another.

4. The IC device of claim 1, wherein said sensor comprises a humidity sensor that is operable for sensing humidity, and said sensing signal comprises a humidity sensing signal.

5. The IC device of claim 4, wherein said humidity sensor comprises a capacitive humidity sensor and said lead frame includes a lead frame aperture for allowing gas flow to reach said humidity sensor.

6. The IC device of claim 1, wherein said lead frame comprises a plurality of flip chip land pads, and wherein said second die is mounted over said flip chip land pads.

7. The IC device of claim 4, wherein said first die comprises an application specific integrated circuit (ASIC) including said signal processor, a memory circuit for storing a calibration algorithm and temperature compensation algorithm, and digital outputs for providing digitized and processed humidity sensing signals.

8. The IC device of claim 4, further comprising:
    at least one molding layer on said lead frame, said molding layer on said first surface to at least over said first die and on said second surface defining a cavity for said second die, and
    a cover for covering at least a portion of said cavity,
    wherein at least one of said molding layer, said lead frame, and said cover define at least one aperture for providing said gas flow access to said humidity sensor.

9. The IC device of claim 8, further comprising a porous layer disposed on or in said aperture.

10. The IC device of claim 9, wherein said porous layer comprises a filter that provides a hydrophobic surface.

11. The IC device of claim 8, wherein said lead frame defines said aperture, and wherein said second die is disposed on said second surface such that said sensor faces said lead frame.

12. The IC device of claim 11, wherein a portion of said second die comprising said sensor overlaps at least a portion of said aperture defined by said lead frame.

* * * * *